(12) United States Patent
Min et al.

(10) Patent No.: US 7,553,738 B2
(45) Date of Patent: Jun. 30, 2009

(54) METHOD OF FABRICATING A MICROELECTRONIC DEVICE INCLUDING EMBEDDED THIN FILM CAPACITOR BY OVER-ETCHING THIN FILM CAPACITOR BOTTOM ELECTRODE AND MICROELECTRONIC DEVICE MADE ACCORDING TO THE METHOD

(75) Inventors: Yongki Min, Phoenix, AZ (US); Huankiat Seh, Phoenix, AZ (US)

(73) Assignee: Intel Corporation, Santa Clara, CA (US)

( * ) Notice: Subject to any disclaimer, the term of this patent is extended or adjusted under 35 U.S.C. 154(b) by 28 days.

(21) Appl. No.: 11/609,295

(22) Filed: Dec. 11, 2006

(65) Prior Publication Data

US 2008/0137263 A1  Jun. 12, 2008

(51) Int. Cl.
H01L 21/20 (2006.01)
(52) U.S. Cl. ............... 438/399; 438/393; 438/381; 438/957; 438/396; 257/532; 257/528; 257/E27.048; 29/25.01; 29/25.03; 29/25.41
(58) Field of Classification Search ............ 257/E23.06, 257/E22.16, 528, E27.048, 532; 438/381, 438/393, 396, 399, 957; 29/25.01, 25.03, 29/25.41
See application file for complete search history.

(56) References Cited

U.S. PATENT DOCUMENTS

| | | | |
|---|---|---|---|
| 5,635,767 A * | 6/1997 | Wenzel et al. ............ 257/778 |
| 6,683,781 B2 * | 1/2004 | Ho et al. .................. 361/301.1 |
| 7,253,504 B1 * | 8/2007 | Zhai et al. .................... 257/668 |
| 2003/0024898 A1 * | 2/2003 | Natsume et al. ............... 216/37 |
| 2004/0211954 A1 * | 10/2004 | Wu et al. ....................... 257/10 |
| 2005/0056878 A1 * | 3/2005 | Shioga et al. ............... 257/300 |
| 2006/0070219 A1 * | 4/2006 | Palanduz et al. ........... 29/25.35 |
| 2006/0130303 A1 * | 6/2006 | Yamasaki et al. .......... 29/25.41 |
| 2006/0180938 A1 * | 8/2006 | Kurihara et al. ............. 257/773 |
| 2006/0220167 A1 * | 10/2006 | Min et al. .................... 257/499 |
| 2006/0262481 A1 * | 11/2006 | Mashiko .................. 361/306.2 |
| 2006/0289976 A1 * | 12/2006 | Min ............................ 257/678 |
| 2007/0001259 A1 * | 1/2007 | Palanduz ..................... 257/532 |
| 2007/0065973 A1 * | 3/2007 | Min ............................. 438/82 |
| 2007/0202655 A1 * | 8/2007 | Min ............................ 438/381 |
| 2008/0003764 A1 * | 1/2008 | Seh et al. .................... 438/393 |

* cited by examiner

*Primary Examiner*—M. Wilczewski
*Assistant Examiner*—Latanya Crawford
(74) *Attorney, Agent, or Firm*—Blakely, Sokoloff, Taylor & Zafman LLP (57) ABSTRACT

A microelectronic device, a method of fabricating the device, and a system including the device. The method includes: providing a substrate including an underlying conductive layer and a polymer build-up layer overlying the underlying conductive layer; providing a passive microelectronic structure; embedding the passive structure in the polymer build-up layer of the substrate; and patterning the passive structure after embedding, patterning including over-etching the bottom electrode layer. The passive microelectronic structure being embedded includes an unpatterned bottom electrode layer; an unpatterned capacitor dielectric layer overlying the bottom electrode layer; and an unpatterned top electrode layer overlying the capacitor dielectric layer.

14 Claims, 7 Drawing Sheets

METHOD OF FABRICATING A MICROELECTRONIC DEVICE INCLUDING EMBEDDED THIN FILM CAPACITOR BY OVER-ETCHING THIN FILM CAPACITOR BOTTOM ELECTRODE AND MICROELECTRONIC DEVICE MADE ACCORDING TO THE METHOD

FIELD

Embodiments of the present invention relate generally to the field of microelectronic fabrication. More specifically, embodiments of the present invention relate to microelectronic substrates including active or passive components embedded therein.

BACKGROUND

The demand for increased mobility in consumer electronics is pressuring manufacturers to scale electronic technologies (e.g., semiconductor devices) to ever smaller dimensions. At the same time, the demand for increased functionality, speed, noise elimination, etc., is forcing manufactures to increase the number of passive components (e.g., capacitors and resistors) used by consumer electronic devices. Passive component integration has traditionally been accomplished by mounting them onto package and/or printed circuit board (PCB) substrate surfaces. Restricting the location of the passive components to the substrate's surface however can limit the passive components' operational capabilities (due to their inherent distance from the semiconductor device) and the substrate's scalability.

One way manufacturers are attempting to address this is by embedding the passive components in the substrate, a technique referred to as embedded passive technology. This frees up surface real estate and facilitates substrate miniaturization. Speed and signal integrity also improves because embedded components provide a more direct path through which the IC signals propagate.

One particular area of interest with respect to embedded passive technology has been the incorporation of thin film capacitors (TFC's) into organic packaging (e.g., bismaleimide triazine resin, etc.) substrates. Among the various materials being considered for use as capacitor dielectrics are high-k ceramic materials. However, high-k ceramic materials can require processing at high temperatures (e.g., furnace annealing at 600-800 degrees Celsius) in order to achieve their high dielectric constant properties. At these temperatures, organic packaging substrates can melt.

Figure 1:
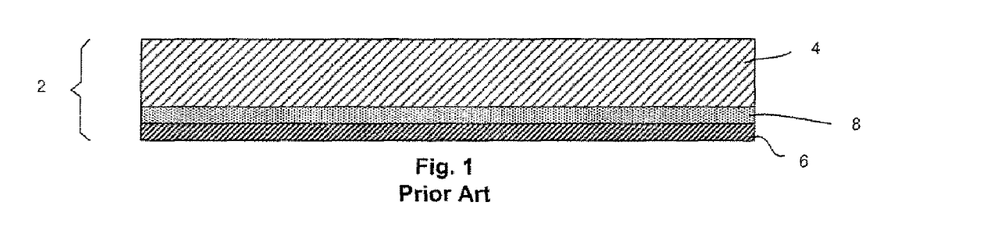
FIGS. 1-5 illustrate cross-sectional views showing formation of an embedded passive component in an organic substrate using conventional methods.
Figure 2:
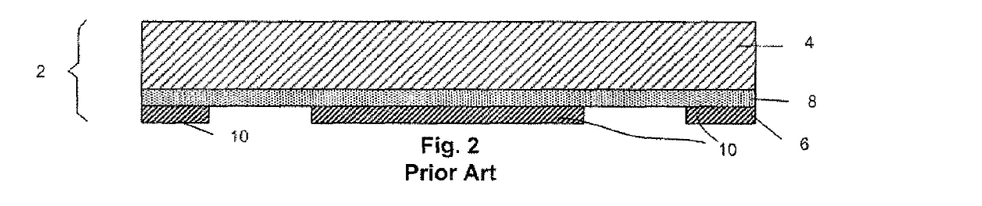
Figure 3:
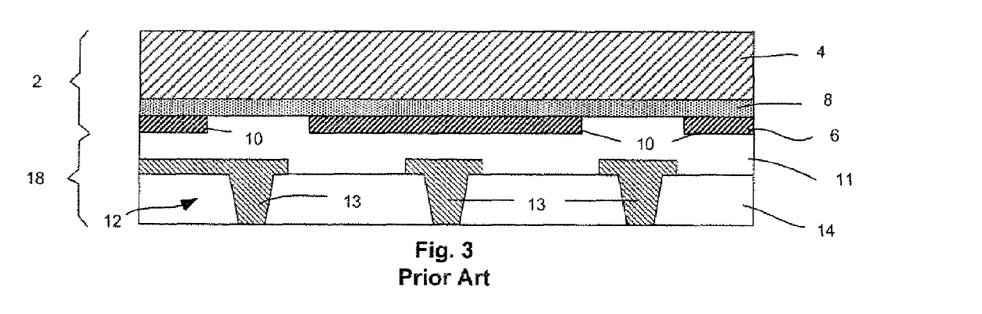
Figure 4:
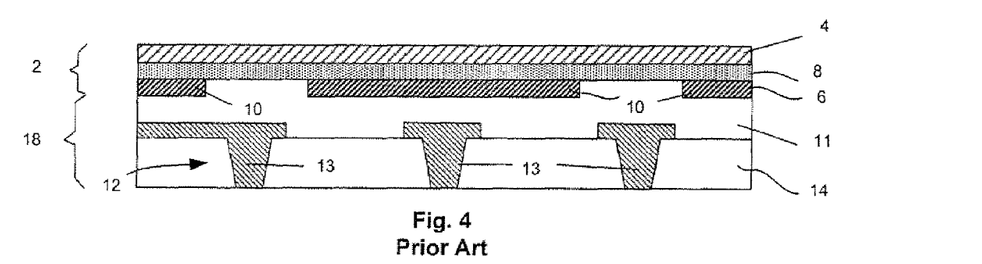
Figure 5:
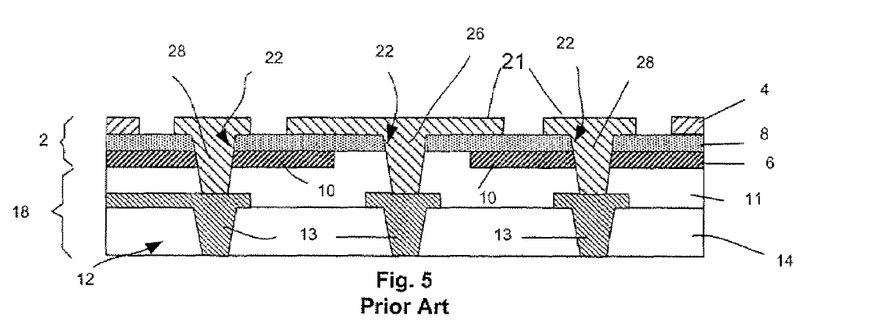

One technique for addressing this involves mounting a pre-fabricated TFC laminate that has already been annealed onto the organic substrate. Shown in FIG. 1 is an example illustration of such a TFC laminate 2, which includes a high-k ceramic material 8, superimposed between conductive films 6 and 4. In FIG. 2, the conductive film 6 portion of the TFC laminate 2 has been patterned to define lower electrode structures 10. In FIG. 3 the partially patterned TFC 2 is then mounted to a substrate 18 that includes polymer build-up layers 11, 14 and copper build-up layer 12. The copper build-up layer 12 connects with underlying conductive structures (not shown) by way of via portions 13. Next, as shown in FIG. 4, the conductive film 4 is thinned and patterned to form upper electrode portions 21. Then, as shown in FIG. 5, via openings 22 are formed thru the high-k ceramic material, the polymer build-up layer 11, and in some cases, portions of the lower electrode structures 10, to expose underlying portions of copper build-up layer 12. As further seen in FIG. 5, a conductive material is deposited in the via openings and over the surface of the TFC where it is then thinned and patterned to form upper electrodes 26, biasing interconnects 28 for the lower electrodes, I/O interconnects 30, build-up interconnect structures, and/or the like.

The use of this integration scheme however is not without its problems. More specifically, any one of the processes used to pattern the lower electrodes 110, the upper electrode portions 21, and/or the via openings 22 can damage the hi-k ceramic dielectric 8 and thereby impact the functionality of the TFC. The patterning of the thin film foil, lamination of a pre-patterned TFC additionally present high risk stages in the fabrication of a package including the TFC.

BRIEF DESCRIPTION OF THE DRAWINGS

FIGS. 9a-12a illustrate stages for patterning a non-patterned TFC embedded in a substrate according to a first embodiment;

FIGS. 9b-13b illustrate stages for patterning a non-patterned TFC embedded in a substrate according to a second embodiment;

For simplicity and clarity of illustration, elements in the drawings have not necessarily been drawn to scale. For example, the dimensions of some of the elements may be exaggerated relative to other elements for clarity. Where considered appropriate, reference numerals have been repeated among the drawings to indicate corresponding or analogous elements.

DETAILED DESCRIPTION

In the following detailed description, a microelectronic device, a method of fabricating the device, and a system incorporating the device are disclosed. Reference is made to the accompanying drawings within which are shown, by way of illustration, specific embodiments by which the present invention may be practiced. It is to be understood that other embodiments may exist and that other structural changes may be made without departing from the scope and spirit of the present invention.

The terms on, onto, above, below, and adjacent as used herein refer to the position of one element relative to other elements. As such, a first element disposed on, onto, above, or below a second element may be directly in contact with the second element or it may include one or more intervening elements. In addition, a first element disposed next to or adjacent a second element may be directly in contact with the second element or it may include one or more intervening elements. In addition, in the instant description and/or figures, figures and/or elements may be referred to in the alternative. In such a case, for example where the description refers to FIGS. X/Y showing an element A/B, what is meant is that FIG. X shows element A and FIG. Y shows element B. In addition, where FIG. X shows a reference numeral A/B and the description refers to element A/B in FIG. X, what is meant is that the element labeled in FIG. X with reference numeral A/B corresponds to either an element labeled in another figure with reference numeral A or to an element labeled in yet another figure with reference numeral B.

Aspects of this and other embodiments will be discussed herein with respect to FIGS. 6-18, below. The figures, however, should not be taken to be limiting, as they are intended for the purpose of explanation and understanding.

Figure 15:
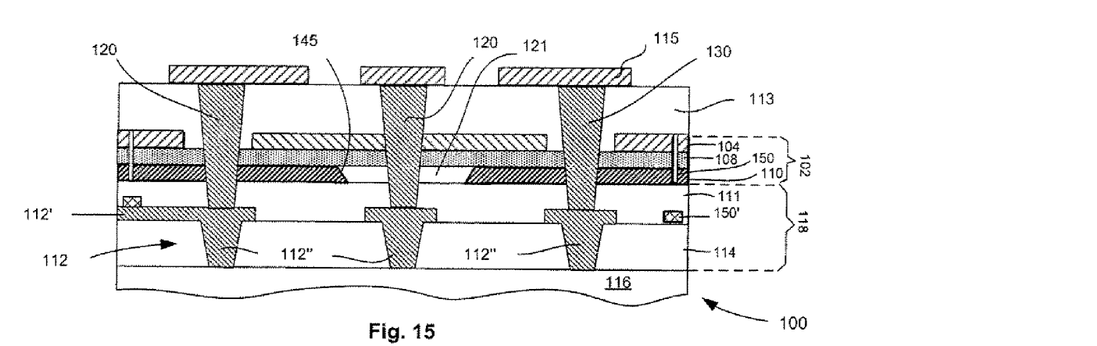

Reference is first made to FIG. 15, where a microelectronic device 100 is shown according to a first embodiment. As seen in FIG. 15, the device includes a passive structure, such as, for example, a TFC 102, embedded in a substrate 118. The passive structure may include a dielectric layer such as, for example, a capacitor dielectric layer 108 of TFC 102. Any number of materials can be used to form the dielectric layer. For example, where the dielectric layer is the capacitor dielectric layer 108, it can include high dielectric constant (high-k) materials such as barium titinate ($BaTiO_3$), strontium titinate ($SrTiO_3$), barium strontium titinate ($BaSrTiO_3$), or the like. For the purposes of this specification and as used by one of ordinary skill, barium titinate and barium strontium titinate are commonly also referred to as BT and BST, respectively. The dielectric layer overlies a bottom conductive layer, which, in the shown embodiment, is in the form of a bottom electrode layer 110 of TFC 102. Bottom electrode layer 110 may include materials such as copper, nickel, platinum and the like. In one embodiment, the bottom electrode layer 110 has a thickness between about 5 to about 40 microns. In one embodiment, the bottom electrode layer 110 is made of copper, and has a thickness between about 10 to about 20 microns. As seen in FIG. 15, a top conductive layer in the form of a top electrode layer 104 overlies the capacitor dielectric layer 108. The top electrode layer 104 may include metal materials, such copper, nickel or the like. The top electrode layer 104 may include a metal foil layer having a thickness between about 50 and about 300 microns. In one embodiment, the top electrode layer 104 includes a nickel foil having a thickness of about 5 to 30 microns. TFC 102 is shown in FIG. 15 as having been embedded in substrate 118. In one embodiment, as shown for example in FIG. 15, the substrate 118 may include a packaging substrate having polymer build-up layers 111, 114 and an underlying conductive build-up layer 112. In such a case 118, substrate 118 may further include underlying layers 116 including a core and additional polymer and conductive build-up layers, as would be recognized by one skilled in the art. The underlying conductive build-up layer 112 includes interconnect layer 112' and vias 112''. The polymer build-up layers 111 and 114 can be formed, for example, using a dielectric material such as Ajinomoto Build-Up Film (ABF). The underlying conductive build-up layer 112 can be formed, for example, using copper. The use and formation of the build-up layers of a package substrate, such as substrate 118, is known to one of ordinary skill. Substrate 118 may, for example, include an organic substrate having a core comprising bismaleimide triazine resin. A substrate according to embodiments is not necessarily limited to a packaging substrate, however, and includes any other type of substrate, such as, for example, a PCB substrate, that could equally serve to embed a passive structure. Device 100 further includes a polymer build-up layer 113 overlying the top electrode layer 104, and a conductive via 120 that extends from interconnect layer 112' through the capacitor dielectric layer 108, the top electrode layer 104 and the build-up layers 111 and 113, up to an interconnect layer 115, via 120 being electrically insulated from the bottom electrode layer 110. An electrical insulation of the conductive via 120 with respect to the bottom electrode layer 110 in the shown embodiment is brought about by the existence of portions of polymer build-up layer 113 in the bottom electrode opening 121 between the via 120 and adjacent portions of the bottom electrode layer 110. As seen in FIG. 15, the bottom electrode opening 121 presents tapered walls 145 which taper in a direction away from the top electrode 104. The tapered walls 145 are the result, in the shown embodiment, of the bottom electrode layer 110 as having been over-etched as will be explained further in relation to FIGS. 9a-12a below. According to one embodiment, the tapered walls 145 present an angle of about 45 degrees with respect to a longitudinal direction of the TFC. The device 100 may further include biasing conductive vias 130 which are coupled to the bottom electrode layer 110, but insulated from the top electrode layer 104 in a well known manner. Device 100 may further include 110 interconnects (not shown), which provide an electrical connection through a TFC without coupling to either of the top or bottom electrode layers.

Figure 16:
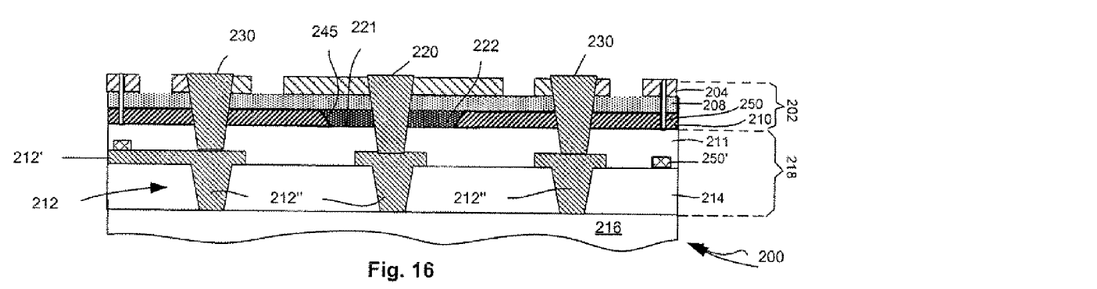
FIG. 16 illustrate a stage of providing a conductive via and an insulation material according to a second embodiment.

Referring now to FIG. 16, a microelectronic device 200 is shown according to a second embodiment. Similar to FIG. 15 described above, the device includes a passive structure, such as, for example, a TFC 202, embedded in a substrate 218. The passive structure may include a dielectric layer such as, for example, a capacitor dielectric layer 208 of TFC 202. The dielectric layer overlies a bottom conductive layer, which, in the shown embodiment, is in the form of a bottom electrode layer 210 of TFC 202. As seen in FIG. 16, a top conductive layer in the form of a top electrode layer 204 overlies the capacitor dielectric layer 208. TFC 202 is shown as having been embedded in substrate 218. In one embodiment, as shown for example in FIG. 16, the substrate 218 may include a packaging substrate having polymer build-up layers 211, 214 and an underlying conductive build-up layer 212. In such a case, substrate 218 may further include underlying layers 216 including a core and additional polymer and conductive build-up layers, as would be recognized by one skilled in the art. The underlying conductive build-up layer 212 includes interconnect layer 212' and vias 212''. It is noted that the materials and specifications for the TFC 202 and substrate 218 may correspond to those materials and specifications already listed above with respect to TFC 102 and substrate 118 of the embodiment of FIG. 15. Referring still to FIG. 16, the device 200 further includes a conductive via 220 that extends through build-up layer 211 and the capacitor dielectric layer 208 to the top electrode layer 204, and that is electrically insulated from the bottom electrode layer 210. Device 200 further includes an insulation material in the form of an insulation plug 222 that surrounds a portion of the side walls of conductive via 220. An electrical insulation of the conductive via 220 in the shown embodiment is thus brought about by the existence of the insulation plug 222 between via 220 and adjacent portions of the bottom electrode layer 210. As seen in FIG. 16, the bottom electrode opening 221 presents tapered walls 245 which taper in a direction away from the top electrode 204. The tapered walls 245 are the result, in the shown embodiment, of the bottom electrode layer 210 as having been over-etched as will be explained further in relation to FIGS. 9b-13b below. According to one embodiment, the tapered walls 245 present an angle of about 45 degrees with respect to a longitudinal direction of the TFC. Similar to device 100 of FIG. 15, device 200 may further include biasing conductive vias 230 which are coupled to the bottom electrode layer 210, but insulated from the top electrode layer 204 in a well known manner. Device 200 may further include I/O interconnects (not shown), which provide an electrical connection through a TFC without coupling to either of the top or bottom electrode layers.

Reference will now be made to FIGS. 6-16, which show stages in practicing a method to fabricate a device such as device 100 of FIG. 15, or such as device 200 of FIG. 16. In particular, while the stages depicted in FIGS. 6-8 and 9b-13b are applicable to the fabrication of either of the embodiments of FIG. 15 or 16, the stages depicted in FIG. 14 pertains solely to the fabrication of the embodiment of FIG. 15. In addition, it is noted that the method embodiment stages of which are depicted FIGS. 14 and 15 on the one hand, and the method embodiment stages of which are depicted in FIG. 16 on the other hand, are shown as having been practiced starting from the structure of FIG. 13b (and thus starting from the structure obtained from practicing a second method embodiment as shown in FIGS. 9b-13b). However, the method embodiments illustrated in FIGS. 14 and 15 on the one hand, and the method embodiment illustrated in FIG. 16 on the other hand, may be practiced equally as well will comparable results starting from the structure of FIG. 13a (and thus starting from the structure obtaining from practicing a first method embodiment as shown in FIGS. 9a-13b). It is further noted that, for the sake of clarity, a depiction of underlying layers 116/216 of the substrate as described above in relation to FIGS. 15 and 16 has been omitted in FIGS. 6-8, 9a-13a, 9b-13b and 14-16.

Figure 6:
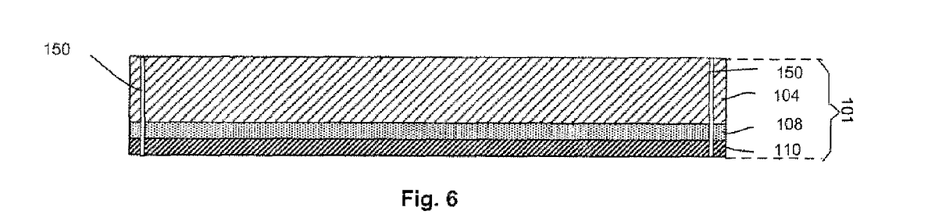
FIGS. 6-8 illustrate various stages for embedding a non-patterned TFC in a substrate according to a first embodiment.
Figure 7:
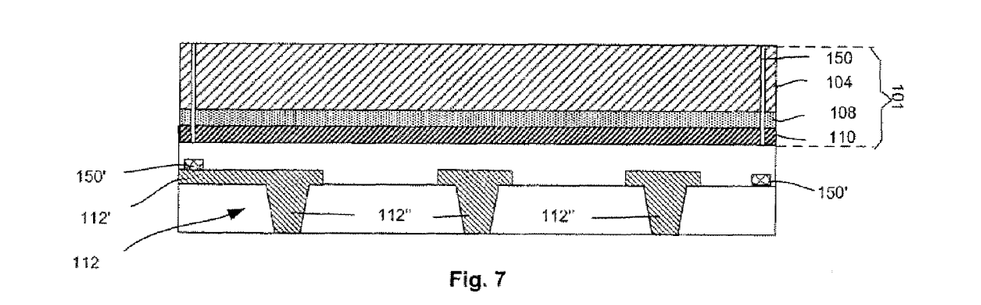
Figure 8:
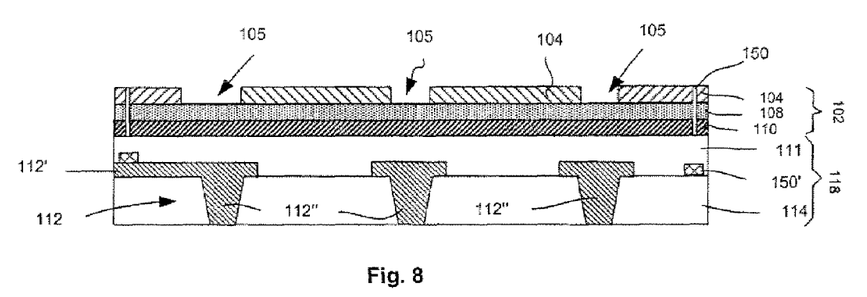

Referring first to FIGS. 6-8, a method of fabricating a microelectronic device according to embodiments includes providing a passive microelectronic structure that is unpatterned, as shown in FIG. 6, embedding the passive structure in a substrate, as shown in FIG. 7, and patterning the passive structure, as shown in part in FIG. 8. It is noted that, in FIGS. 6-8, 9a-13a and 9b-13b, for the sake of clarity, elements corresponding to similar elements in either of FIG. 15 or 16 described above are labeled with reference numerals corresponding to their counterparts in FIG. 15 only (that is, for example, TFC 102/202 is referred to only as TFC 102). Thus, in the description of FIGS. 6-8, reference to the various components may equally be used to form the device 100 of FIG. 15 or the device 200 of FIG. 16 as described above. It is also noted that elements in either of FIGS. 6-8, 9a-13a and 9b-13b corresponding to existing elements in either of FIG. 15 or 16 may be made of the same materials and to the same specifications as described above in relation to FIG. 15 or 16.

Referring first to FIG. 6, a method embodiment includes providing a passive microelectronic structure 101 which includes an unpatterned bottom electrode layer 110, an unpatterned capacitor dielectric layer 108 overlying the bottom electrode layer 110, and an unpatterned top electrode layer 104 overlying the capacitor dielectric layer 108. Structure 101 is shown as having been provided with fiducials, such as, for example, drilled fiducials 150 as would be well known in the art.

Referring next to FIG. 7, a method embodiment includes embedding the passive structure 101 in a substrate 118. For example, embedding may include aligning the fiducials 150 on the passive structure 101 to substrate level fiducials 150'. The substrate level fiducials 150' may be patterned at the conductive layer below the polymer layer 111, not only at a panel-level, but also at a unit-level relative to the panel-level. It is noted however that embodiments do not require the use of fiducials, but that fiducials are an option according to embodiments. Embedding may further include mounting the unpatterned passive structure 101 onto a polymer build-up layer 111 of a substrate 118. The polymer build-up layer 111 as shown in FIG. 7 may for example be a B-stage, uncured, dielectric layer, as would be well known by one skilled in the art. Embedding as shown in FIG. 7 may include curing the polymer build-up layer 111 in a well known manner.

Referring to FIG. 8, a method embodiment may include patterning the passive structure 101 after embedding. In the shown embodiment, patterning includes first thinning the top electrode layer 104, and then patterning the same to form openings 105 therein that expose portions of the capacitor dielectric layer 108. Thinning may involve, according to one embodiment, using, for instance, a wet etch process, a dry etch process, a polishing process, combinations thereof, or the like. To the extent that the top electrode layer may include nickel, thinning can be accomplished by etching it with a wet etchant, such as ferric chloride ($FeCl_3$). In one embodiment, the top electrode layer 104 may be thinned to between approximately 10-20 microns. Thinning facilitates patterning of the top electrode layer structures by reducing the amount of conductive material that must be removed. After thinning, the top electrode layer 104 may be patterned with resist and then etched to define the openings 105 as shown. Etching can be accomplished using wet or dry etch processes. In one embodiment, the top electrode layer 104 may be etched using a ferric chloride solution.

After formation of the structure of FIG. 8, a method embodiment includes patterning a passive structure including patterning a capacitor dielectric layer of the structure, over-etching a bottom electrode layer of the structure through a capacitor dielectric opening to yield a bottom electrode opening, providing an insulation material in the bottom electrode opening, and providing a conductive via electrically insulated from the bottom electrode layer by the insulation material.

Reference will now be made to FIGS. 9a-13a, which show stages in patterning the passive structure, such as TFC 102, according to a first embodiment, starting for example from the structure of FIG. 8 as noted above.

Figure 9A:
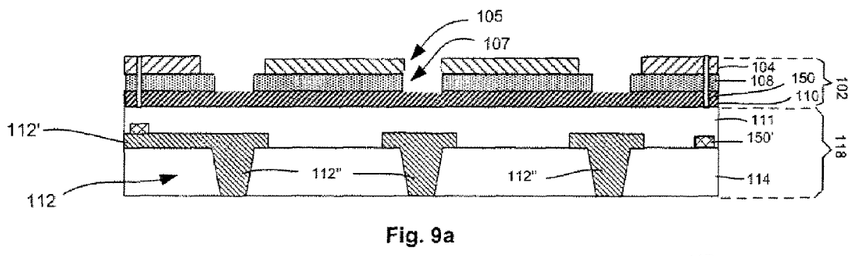

As seen in FIG. 9a, patterning the capacitor dielectric layer according to a first method embodiment comprises patterning the capacitor dielectric layer 108 to form a capacitor dielectric opening 107 in registration with top electrode opening 105 that exposes a portion of the bottom electrode layer 110. Patterning of the dielectric layer 108 may be accomplished using a conventional lithographic and etch patterning process, sand-blasting, laser drilling, or the like.

Figure 10A:
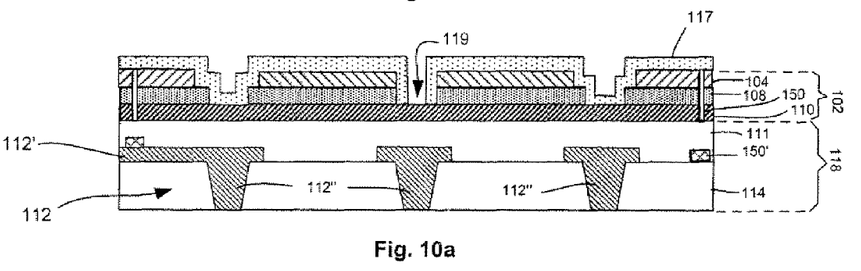

Referring next to FIG. 10a, a first method embodiment of patterning the passive structure further includes providing a patterned resist layer 117 onto the top electrode layer 104. As seen in FIG. 10a, the patterned resist layer 117 may be patterned such that it covers side walls of the top electrode opening 105 and side walls of the capacitor dielectric opening 107, and further such that it defines a resist opening 119 exposing a portion of the bottom electrode layer 110. Provision and patterning of the resist layer 117 may be performed according to any one of well known methods, such as, for example, coating resist material onto the top electrode layer 104 and developing the same to define the resist opening 119. Preferably, where over-etching the bottom electrode layer 110 is to involve wet etching, the material of the resist layer is chosen to allow wet etching, and may include, for example, a photo-sensitive polymer film known as a dry film resist, or, in the alternative, a liquid type of resist.

Figure 11A:
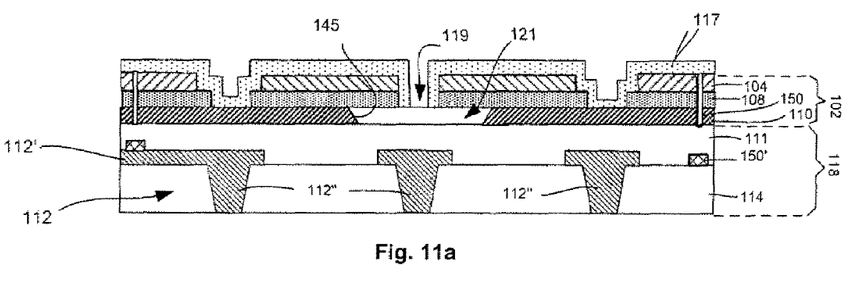

Referring next to FIG. 11a, a first method embodiment of patterning the passive structure further includes over-etching the bottom electrode layer 110 through the resist opening 119 in order to define a bottom electrode opening 121. As used herein, "over-etching" means etching beyond boundaries of the bottom electrode opening 121 such that the bottom electrode opening 121 is wider than the capacitor dielectric opening 107. Wet etching may take place according to any one of well known methods, such as, for example, through the use of Ni, or FeCl3 as the etchants. An extended etching time may be providing for enabling over-etching as a function of the etch rate of the metal of the bottom electrode. For cleaning, a well known cleaning method, such as the use of DI water, may be effected for a bottom electrode having a thickness of about 30 microns and a via hole having a diameter of about 60-100 microns. As noted with respect to FIG. 15 above, over-etching of the bottom electrode layer 110 results in walls of opening 121 having a narrowing or tapering profile in the form of tapering walls 145 tapering in a direction away from the top electrode.

Figure 12A:
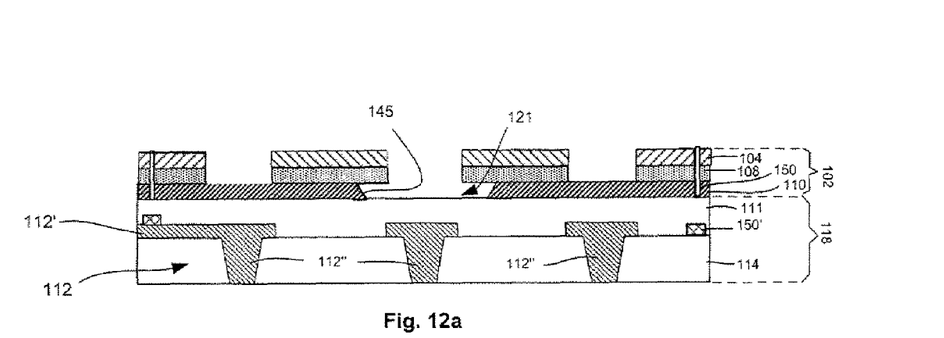

Referring now to FIG. 12a, a first method embodiment of patterning the passive structure may include removing the patterned resist layer 117 from the top electrode layer 110. Removing the patterned resist layer 117 may include, for example, using a solvent to remove the dry film resist, or using an asher, as is well known.

Reference will now be made to FIGS. 9b-13b, which show stages in patterning the passive structure, such as TFC 102, according to a second embodiment, starting for example from the structure of FIG. 8 as noted above.

Figure 9B:
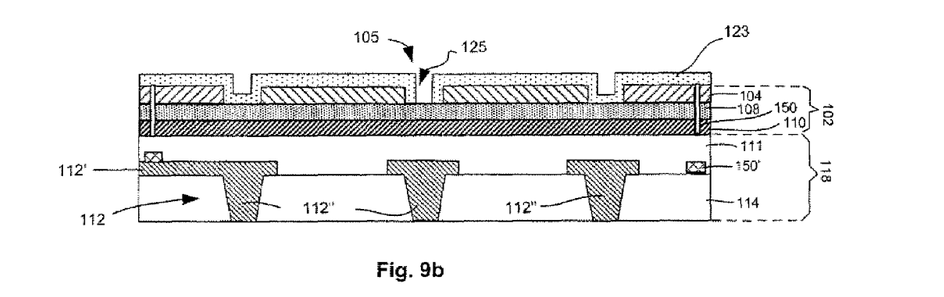

As seen in FIG. 9b, a second method embodiment of patterning the passive structure includes providing a patterned resist layer 123 onto the top electrode layer 104. As seen in FIG. 9b, the patterned resist layer 123 may be patterned such that it covers side walls of the top electrode opening 105, and further such that it defines a resist opening 125 exposing a portion of the capacitor dielectric layer 108. Provision and patterning of the resist layer 123 may be performed according to any one of well known methods, such as, for example, coating resist material onto the top electrode layer 104 and developing the same to define the resist opening 125. Preferably, where over-etching the bottom electrode layer 110 is to involve wet etching, the material of the resist layer is chosen to allow wet etching, and may include, for example, any of the materials listed in relation to FIG. 10a above.

Figure 10B:
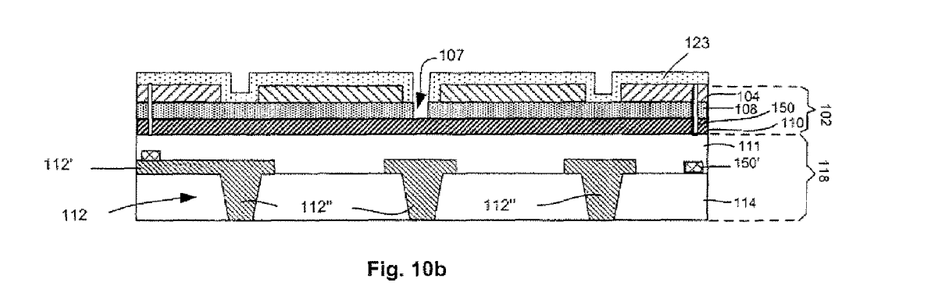

Referring now to FIG. 10b, a second method embodiment of patterning the passive structure further includes patterning the capacitor dielectric layer 108 to form a capacitor dielectric opening 107 in registration with top electrode opening 105 that exposes a portion of the bottom electrode layer 110. Patterning of the dielectric layer 108 may be accomplished in the same manner as the patterning of the dielectric layer 108 according to the first method embodiment of patterning as shown in FIG. 9a, for example using a conventional lithographic and etch patterning process, sand-blasting, or the like, However, in the shown embodiment, patterning of the capacitor dielectric layer 108 takes place through the opening of a resist layer different from a resist layer which may have been used to patterned the top electrode layer as shown in FIG. 8. The above is in contrast with the first embodiment of patterning, where, as shown for example in FIG. 9a, the top electrode layer 104 and the capacitor dielectric layer 108 may have been patterned through the same resist layer. As a result, in the case of the second method embodiment for patterning as shown in FIG. 10b, the opening 107 of the capacitor dielectric layer 108 may be smaller than the opening 105 of the top electrode layer.

Figure 11B:
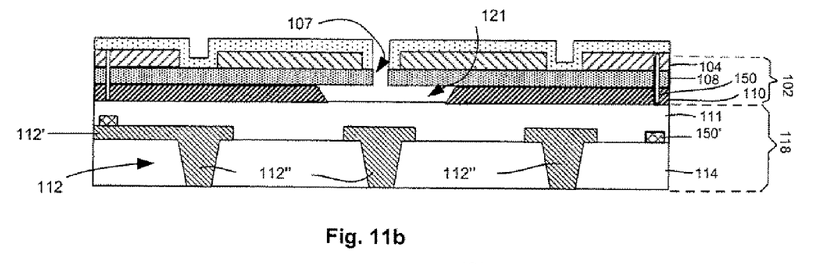

Referring next to FIG. 11b, a second method embodiment of patterning the passive structure further includes over-etching the bottom electrode layer 110 through the resist opening 125 and through the capacitor dielectric opening 107 in order to define a bottom electrode opening 121. As in the case of the first method embodiment of patterning and FIG. 11a described above, wet etching may take place according to any one of well known methods, such as, for example, through the use of Ni, or FeCl3 as the etchants. An extended etching time may be providing for enabling over-etching as a function of the etch rate of the metal of the bottom electrode. For cleaning, a well known cleaning method, such as the use of DI water, may be effected for a bottom electrode having a thickness of about 30 microns and a via hole having a diameter of about 60-100 microns. As noted with respect to FIG. 16 above, over-etching of the bottom electrode layer 110 results in walls of opening 121 having a narrowing or tapering profile in the form of tapering walls 145 tapering in a direction away from the top electrode.

Figure 12B:
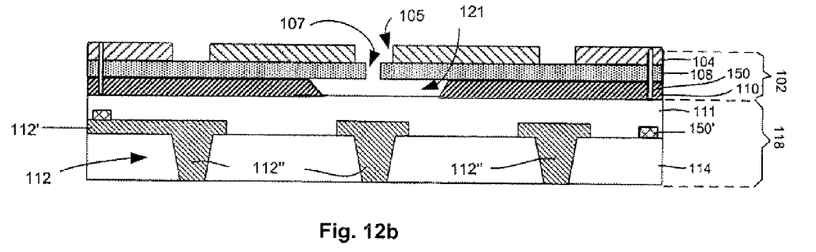

Referring now to FIG. 12b, a second method embodiment of patterning the passive structure may include removing the patterned resist layer 123 from the top electrode layer 110. Removing the patterned resist layer 123 may include, for example, using a solvent to remove the dry film resist, or using an asher, as is well known.

Figure 13B:
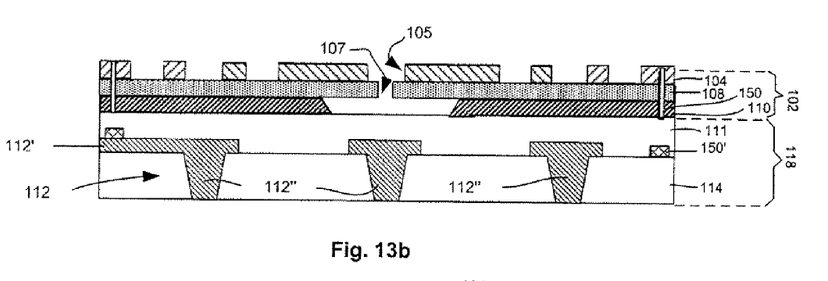

Referring next to FIG. 13b, similar to the first method embodiment of patterning the passive structure as depicted in FIG. 13a, a second method embodiment of patterning the passive structure may include further patterning the top electrode layer 104 after over-etching the bottom electrode layer 110. Further patterning may include any one of well known methods for patterning a conductive layer, such as, for example, a conventional lithographic and etch patterning process, a lift-off process, or the like. Patterning may involve patterning the top electrode layer 110 so as to allow a subsequent isolation of conductive vias 120 and 130 (see FIGS. 15 and 16) from one another at the top electrode level.

Figure 14:
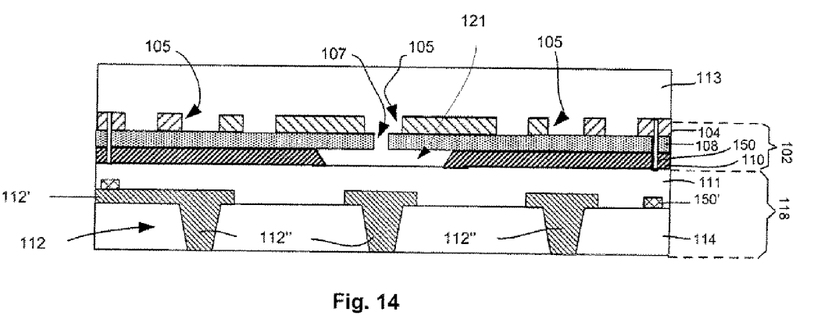
FIGS. 14 and 15 illustrate stages of providing a conductive via and an insulation material according to a first embodiment.

Reference will now be made to FIG. 14, and again to FIG. 15 with respect to a first method embodiment of providing a conductive via, and thereafter to FIG. 16 with respect to a second method embodiment of providing a conductive via. FIGS. 14 and 15 on the one hand, and FIG. 16 on the other hand, show stages in providing a conductive via 120 extending from the underlying conductive layer 112 of substrate 118 through 1, the polymer build-up layer 111 of the substrate, the conductive via 120 being insulated from the bottom conductive layer by an insulation material.

Referring now to FIG. 14, according to a first method embodiment of providing a conductive via, an insulation material may be provided in the bottom electrode opening 121 of the bottom electrode layer 110 by providing a polymer build-up layer 113 onto the top electrode layer 104 such that material from the polymer build-up layer 113 penetrates the bottom electrode opening to eventually insulate the conductive via 120 (see FIG. 15) from the bottom electrode layer 110. The build-up layer 113 may, for example, be laminated onto the top electrode layer 104 in a well known manner.

Thereafter, referring now to FIG. 15, a first method embodiment of providing a conductive via includes providing a via opening that extends from the top portion of the polymer build-up layer 113 through that layer to underlying conductive structure 112 of the substrate 118. The via opening may, for example, be provided in a well known manner using laser drilling. Additional via openings may be provided through the build-up layer 111 to the underlying conductive build-up layer 112 for the subsequent provision, in a well known manner, of vias 130 biased to the bottom electrode layer 110 based on application needs. Referring still to FIG. 15, providing a conductive via according to the first embodiment further includes filing the via opening with conductive material to provide the conductive via 120. Conductive material may be deposited in all via openings according to any one of well known techniques, such as, for example, electroplating, electroless plating, PVD or the like. After the deposition of the conductive material in the via openings, a conductive layer may be deposited onto the polymer build up layer 113 and vias 120 and 130, and thereafter thinned and patterned in a conventional manner to provide the interconnect layer 113. Patterning can be accomplished using a conventional lithographic and etch patterning process, a lift-off process, or the like. As in the case of the embodiment of FIG. 10, patterning may involve patterning the conductive material so as to isolate the conductive vias from one another. The structure shown in FIG. 10 may be created using a semi-additive process, using, for example, lithographic alignment based on substrate-level fiducials 150'.

Referring now to FIG. 16, a second embodiment of providing a conductive via 120 includes providing an insulation plug 222 in the bottom electrode opening 221. The insulation plug may include, for example, a resin, and may be provided in the bottom electrode opening using a device to introduce the resin into the opening with pressure. The resin may thereafter be cured to provide the plug 222. According to embodiments, any material, such as a polymer, which may have desirable electrical insulation properties and which may flow into the opening 221 could be used for the plug 222. Thereafter, providing a conductive via according to the second method includes providing a via opening that extends from the top portion of the top electrode layer 204 through that layer to underlying conductive structure 212 of the substrate 218. The via opening may, for example, be provided in a well known manner using laser drilling. Additional via openings may be provided through the build-up layer 211 to the underlying conductive build-up layer 212 for the subsequent provision, in a well known manner, of vias 230 biased to the bottom electrode layer 210 based on application needs. Referring still to FIG. 16, providing a conductive via according to the first embodiment further includes filing the via opening with conductive material to provide the conductive via 220. Conductive material may be deposited in all via openings according to any one of well known techniques, such as, for example, electroplating, electroless plating, PVD or the like.

Figure 17:
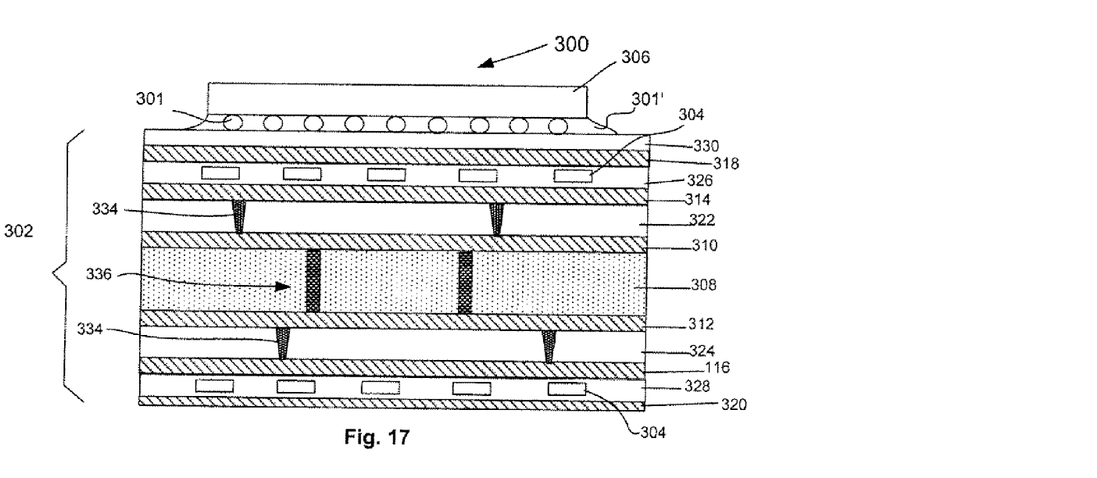
FIG. 17 illustrates a package including a TFC embedded in a substrate according to an embodiment.

Referring now to FIG. 17, that figure shows a package 300 including a microelectronic substrate 302 having embedded components 304, such as, for example) embedded TFC's, therein according to an embodiment, a microelectronic die 306 being flip-chip mounted onto the substrate 302 using solder joints 301 and an underfill material 301' in a well known manner. Other mounting configurations for the die 306 are within the purview of embodiments. Package 300 may be used for example to couple the components 304 and/or the die 306 to a circuit board, or to couple a processor or processing system to a motherboard according to application needs. The substrate 302 includes a core 308, which may be a commercially available core using, for example, FR4, FR5 or organic materials such as Bismaleimide Triazine (BT) as the dielectric material. The core may further include a glass-reinforced epoxy PCB material with copper cladding Other types of cores are within the purview of embodiments. The substrate 302 as shown further includes conductive layers 310, 312, 314, 316, 318 and 320, and, in addition, dielectric build-up layers 322, 324, 326, 328, 330 and 332, which layers may conform to conventional configurations for such layers as commonly used in multilayer substrate structures. The conductive layers and build-up layers are shown schematically in the figure, and it is to be understood that those layers are not necessarily continuous layers as seems to be suggested in the schematic depiction, but have a configuration adapted to allow the routing of electricity/signals at various levels within a multilayer substrate as would be readily recognized by one skilled in the art. Thus, by way of example, each of the conductive layers 310-320 may have been plated onto a corresponding build-up layer and then patterned to form traces therefrom according to application needs, each layer of traces being referred to herein as a conductive layer. Similarly, each of the dielectric build-up layers 322-332 may have been provided with vias extending therethrough, such as, for example, vias 334, in order to connect respective conductive layers to one another. Vias 336 may further be provided through the core 308 as shown according to application needs. As seen in FIG. 17, build-up layers 326 and 328 each include microelectronic components 304 embedded therein, each of the components 304 being either active or passive as dictated by a particular predetermined design for the substrate. The microelectronic components 104 may include preformed active or passive components. Active components would include, for example, transistors, MOSFETs, junction diodes, etc. Passive components would include, for example, capacitors, inductors, resistors, etc. The microelectronic components 304 may include components for decoupling, radio frequency tuning or voltage regulation, as would be recognized by one skilled in the art.

Advantageously, embodiments address high risk processes in integrated pre-patterned thin film components into organic substrates by enabling tighter design rules, in this manner facilitating future scalability of TFC technology. By presenting a novel structure in the form of a bridging interconnect, embodiments allow embedding a completely unpatterned TFC into a build-up substrate, substantially mitigating design impacts associated with alignment tolerances of the prior art, and eliminating process flow requiring the patterning of thin film foil or the laminating of pre-patterned TFC's. Thus, embodiments allow the use of a low risk and scaleable embedding process with a tighter via pitch for high volume manufacturing and next generation products. Currently, the embedding of pre-patterned TFC's require a precise positioning of the TFC onto a substrate so the vias on the TFC's can be electrically connected to the existing underlying conductive structure of the substrate. Embodiments mitigate errors associated with the prior art embedding of TFC's, including errors due to the use of global alignment, lamination errors, errors from TFC patterning, etc. Such errors typically require design rules to be loose to accommodate a high yield requirement for the substrate. However, loose design rules limit the capability/scalability of TFC embedding technology against future design rules. Embodiments allow alignment based only on substrate fiducials, thus eliminating some sources of alignment error. In addition, advantageously, embodiments eliminate the need for TFC patterning prior to delivery by the supplier/prior to embedding by allowing a patterning of the bottom electrode layer through over-etching. Embodiments can use existing process flow stages allowing the use of current capability and equipment for enabling TFC technology.

Figure 18:
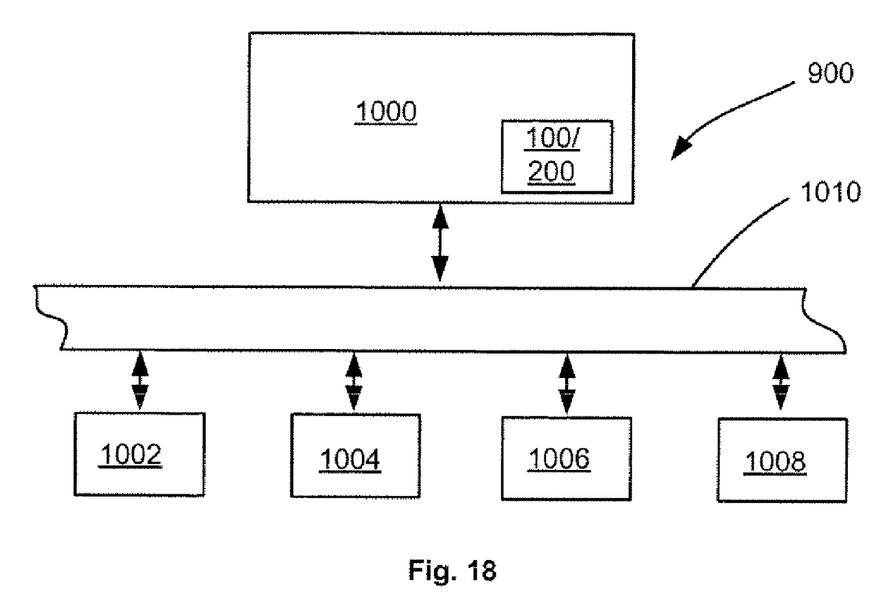
FIG. 18 is a schematic view of a system including a package similar to either of the packages shown in FIG. 15 or 16.

Referring to FIG. 18, there is illustrated one of many possible systems 900 in which embodiments of the present invention may be used. In one embodiment, the electronic assembly 1000 may include a microelectronic device such as device 100 of FIG. 15 or device 200 of FIG. 16. Assembly 1000 may further include a microprocessor. In an alternate embodiment, the electronic assembly 1000 may include an application specific IC (ASIC). Integrated circuits found in chipsets (e.g., graphics, sound, and control chipsets) may also be packaged in accordance with embodiments of this invention.

For the embodiment depicted by FIG. 18, the system 900 may also include a main memory 1002, a graphics processor 1004, a mass storage device 1006, and/or an input/output module 1008 coupled to each other by way of a bus 1010, as shown Examples of the memory 1002 include but are not limited to static random access memory (SRAM) and dynamic random access memory (DRAM). Examples of the mass storage device 1006 include but are not limited to a hard disk drive, a compact disk drive (CD), a digital versatile disk drive (DVD), and so forth. Examples of the input/output module 1008 include but are not limited to a keyboard, cursor control arrangements, a display, a network interface, and so forth. Examples of the bus 1010 include but are not limited to a peripheral control interface (PCI) bus, and Industry Standard Architecture (ISA) bus, and so forth. In various embodiments, the system 90 may be a wireless mobile phone, a personal digital assistant, a pocket PC, a tablet PC, a notebook PC, a desktop computer, a set-top box, a media-center PC, a DVD player, and a server.

The various embodiments described above have been presented by way of example and not by way of limitation. Having thus described in detail embodiments of the present invention, it is understood that the invention defined by the appended claims is not to be limited by particular details set forth in the above description, as many variations thereof are possible without departing from the spirit or scope thereof.

What is claimed is:

1. A method of fabricating a microelectronic device comprising:
    providing a substrate including an underlying conductive layer and a polymer build-up layer overlying the underlying conductive layer;
    providing a passive microelectronic structure including:
        an unpatterned bottom electrode layer;
        an unpatterned capacitor dielectric layer overlying the bottom electrode layer; and
        an unpatterned top electrode layer overlying the capacitor dielectric layer;
    embedding the passive structure in the polymer build-up layer of the substrate; and
    patterning the passive structure after embedding, patterning including over-etching the bottom electrode layer, where in said patterning comprises:
    patterning the top electrode layer to form a top electrode opening that exposes a portion of the capacitor dielectric layer; and
    patterning the capacitor dielectric layer to form a capacitor dielectric opening in registration with the top electrode opening that exposes a portion of the bottom electrode layer; and
    over-etching the bottom electrode layer comprises wet etching the bottom electrode layer through the top electrode opening and the capacitor dielectric opening to define an opening in the bottom electrode layer that is wider than the capacitor dielectric opening;
    after patterning the top electrode layer and the capacitor dielectric layer;
    providing a patterned resist layer onto the top electrode layer such that the resist covers side walls of the top electrode opening and the capacitor dielectric opening and further defines a resist opening exposing a portion of the bottom electrode layer, the resist opening being in registration with the top electrode opening and the capacitor dielectric opening;
    wet etching the bottom electrode layer through the resist opening to define a bottom electrode opening in the bottom electrode layer wider than the capacitor dielectric opening; and
    removing the patterned resist layer after wet etching.

2. The method of claim 1, including further patterning the top electrode layer after wet-etching.

3. The method of claim 1, further comprising, after wet etching:
    providing an insulation material in the bottom electrode opening; and
    providing a conductive via extending from the underlying conductive layer of the substrate through the polymer build-up layer of the substrate, the conductive via being electrically insulated from the bottom conductive layer by the insulation material.

4. The method of claim 3, wherein:
    the polymer build-up layer is a first polymer build-up layer; and
    providing the insulation material comprises providing a second polymer build-up layer onto the top electrode layer such that material from the second polymer build-up layer penetrates the bottom electrode opening to insulate the conductive via from the bottom electrode layer.

5. The method of claim 3, wherein providing the insulation material comprises providing an insulation plug in the bottom electrode opening.

6. The method of claim 3, wherein providing a conductive via comprises:
    providing a via opening through the insulation material and the polymer build-up layer to the conductive build-up layer; and
    filling the via opening with a conductive material.

7. The method of claim 3, wherein the conductive via is a top electrode conductive via, the method further comprising providing a bottom electrode conductive via extending through the capacitor dielectric layer, connected to the bottom electrode layer, and insulated from the top electrode layer.

8. The method of claim 1, wherein the capacitor dielectric layer includes a ceramic dielectric material.

9. The method of claim 8, wherein the ceramic dielectric material is selected from the group consisting of strontium titanate, barium strontium titanate, and/or barium titinate.

10. The method of claim 1, wherein the substrate is an organic substrate.

11. The method of claim 10, wherein the substrate includes a core comprising bismaleimide triazine resin.

12. The method of claim 1, wherein patterning the capacitor dielectric layer comprises one of dry-etching and sand-blasting.

13. The method of claim 1, wherein wet etching comprises using one of Ni and FeCl3.

14. A method of fabricating a microelectronic device comprising:
    providing a substrate including an underlying conductive layer and a
    polymer build-up layer overlying the underlying conductive layer;
    providing a passive microelectronic structure including:
        an unpatterned bottom electrode layer;
        an unpatterned capacitor dielectric layer overlying the bottom electrode layer; and
        an unpatterned top electrode layer overlying the capacitor dielectric layer;
    embedding the passive structure in the polymer build-up layer of the substrate; and
    patterning the passive structure after embedding, patterning including over-etching the bottom electrode layer by wet etching;
    wherein wet etching comprises, after patterning the top electrode layer:
    providing a patterned resist layer onto the top electrode layer such that the resist covers side walls of the top electrode opening and further defines a resist opening exposing a portion of the capacitor dielectric layer, the resist opening being in registration with the top electrode opening;

patterning the capacitor dielectric layer through the resist opening;

wet etching the bottom electrode layer through the resist opening to define an opening in the bottom electrode layer wider than the top electrode opening and the capacitor dielectric opening; and removing the patterned resist layer after wet etching.

* * * * *